United States Patent
Sekijima et al.

(10) Patent No.: US 7,154,050 B2
(45) Date of Patent: Dec. 26, 2006

(54) CABLE ARRANGING STRUCTURE

(75) Inventors: Daishiro Sekijima, Tokyo (JP); Hideho Inagawa, Kanagawa (JP); Satoshi Sugimoto, Kanagawa (JP); Seiji Hayashi, Kanagawa (JP); Shinichi Nishimura, Kanagawa (JP)

(73) Assignee: Canon Kabushiki Kaisha, Tokyo (JP)

( * ) Notice: Subject to any disclaimer, the term of this patent is extended or adjusted under 35 U.S.C. 154(b) by 380 days.

(21) Appl. No.: 10/676,283

(22) Filed: Sep. 30, 2003

(65) Prior Publication Data
US 2004/0065472 A1 Apr. 8, 2004

(30) Foreign Application Priority Data
Oct. 2, 2002 (JP) ............................. 2002-290041

(51) Int. Cl.
*H05K 9/00* (2006.01)
(52) U.S. Cl. ...................... 174/369; 174/376; 174/377; 361/800
(58) Field of Classification Search .............. 174/35 R, 174/35 GC, 369, 376, 377; 361/816, 818, 361/800
See application file for complete search history.

(56) References Cited

U.S. PATENT DOCUMENTS

| | | | | |
|---|---|---|---|---|
| 3,350,497 A | * | 10/1967 | Weaver, Jr. et al. | ... 174/35 MS |
| 3,562,402 A | * | 2/1971 | Dwyer | ................... 174/35 GC |
| 5,164,543 A | * | 11/1992 | Benson et al. | ............ 174/35 R |
| 5,680,297 A | * | 10/1997 | Price et al. | .................. 361/818 |
| 5,770,898 A | * | 6/1998 | Hannigan et al. | ........... 307/147 |
| 6,093,888 A | * | 7/2000 | Laureanti et al. | ......... 174/35 R |
| 6,172,881 B1 | * | 1/2001 | Hirai | .......................... 361/816 |
| 6,188,016 B1 | * | 2/2001 | Enstrom et al. | .......... 174/35 R |
| 6,411,523 B1 | * | 6/2002 | Roberson et al. | ........... 361/800 |
| 6,573,804 B1 | * | 6/2003 | Hayashi | ....................... 333/32 |
| 2002/0179313 A1 | * | 12/2002 | Hirai | ........................... 174/34 |

FOREIGN PATENT DOCUMENTS

| | | |
|---|---|---|
| JP | 6-3877 | 1/1994 |
| JP | 11-40900 | 2/1999 |

* cited by examiner

*Primary Examiner*—Hung V. Ngo
(74) *Attorney, Agent, or Firm*—Morgan & Finnegan, LLP

(57) ABSTRACT

A cable arranging structure for exchanging electric signals between a pair of printed circuit boards includes at least a pair of electrically conductive members adapted to arrange the cable between them over the entire length thereof. The electrically conductive members show an electric potential substantially equal to that of the ground. Such a structure requires only the two electrically conductive members to be rigidly secured so that radiant noises generated by the cable can be effectively suppressed by means of the structure without the need of deforming the cable.

5 Claims, 11 Drawing Sheets

HORIZONTALLY POLARIZED WAVES

VERTICALLY POLARIZED WAVES

HORIZONTALLY POLARIZED WAVES

VERTICALLY POLARIZED WAVES

HORIZONTALLY POLARIZED WAVES

VERTICALLY POLARIZED WAVES

CABLE ARRANGING STRUCTURE

BACKGROUND OF THE INVENTION

1. Field of the Invention

This invention relates to a cable arranging structure that can suitably be applied to an electric signal transmission cable by way of which printed circuit boards transmit and receive electric signals in an electronic device.

2. Related Background Art

Electronic devices have been made to operate at increasingly high speed and perform excellently in recent years. As a result, however, there has been a problem that radiant noises of electronic devices adversely affect operations of other electronic devices. The adverse effects of radiant noises of electronic devices on other electronic devices are collectively referred to as EMI (electromagnetic interference). Such noises can give rise to operation errors of electronic devices. In view of this problem, a frequency band in which radiant noises are particularly serious is defined by law and the extent of noise radiation from an electronic device in this frequency band is rigorously controlled by regulations. Manufacturers of electronic devices are required to design products conforming to the regulations.

Radiant noises of electronic devices are generated by printed circuit boards and cables connecting printed circuit boards. Particularly, cables that are arranged to transmitting electric signals from a printed circuit board to another have become particularly serious sources of radiant noises as a result of the technological development of transmitting signals at high speed in recent years. Thus, it is a technological challenge how to effectively suppress radiant noises coming from cables.

Japanese Patent Application Laid-Open No. 6-3877 proposes a technique of covering a cable with an electrically conductive member in order to suppress radiant noises coming from the cable. According to Japanese Patent Application Laid-Open No. 6-3877, radiant noises are suppressed and prevented from affecting other loads by containing a cable (harness) that connects printed circuit boards in a duct made of an electrically conductive ferromagnetic material, e.g., a soft iron pipe, that is formed on the frame of a digital copying machine.

Japanese Patent Application Laid-Open No. 11-40900 proposes a cable arranging structure for tightly holding a cable (electrically conductive wires) close to a cabinet. The proposed technique is intended to suppress radiant noises even in the area where the cable is connected to a printed circuit board, particularly by deforming the electrically conductive surface of the printed circuit board, connecting it to the cabinet and arranging the cable close to the deformed surface.

However, in the case of a structure for arranging a cable in a duct as described in above cited Japanese Patent Application Laid-Open No. 6-3877, the cable and the electrically conductive surface are separated from each other by a large distance in the area where the cable is connected to the printed circuit board so that radiant noises are boosted rapidly in that area. Then, it is highly difficult to form a duct that entirely contains the cable including the parts where they are connected to printed circuit boards, although the difficulty may vary depending on the configuration of the electronic device and the arrangement of printed circuit boards. Particularly, preparation of a duct can be costly and require a large amount of work to be done when the duct has bent areas to show a complicated profile.

A structure for arranging a cable close to a cabinet as described in Japanese Patent Application Laid-Open No. 11-40900, on the other hand, essentially requires the cable to be warped and/or bent before it is arranged along the cabinet. Therefore, the technique is accompanied by a problem that an excessive load is applied onto the cable and the cable may not be able to be laid close to the cabinet depending on its structure. The problem of difficulty of laying a cable along the cabinet is very remarkable particularly when the distance separating two printed circuit boards is small. Additionally, the cable needs to be rigidly confined or anchored by some means or another so as to allow it to be constantly arranged close to the cabinet. These and other reasons make the structure very complex and costly. Furthermore, Japanese Patent Application Laid-Open No. 11-40900 describes an arrangement for laying a cable close to a cabinet by deforming the cabinet as shown in FIG. 7(B) of the patent document. Then, the cabinet needs to be previously processed for the deformation. Such an arrangement is not realistic because preparation of such a cabinet is costly and requires a large amount of work to be done.

SUMMARY OF THE INVENTION

Therefore, the object of the present invention is to realize a structure for arranging a cable to be used for exchanging electric signals between a pair of printed circuit boards that can suppress radiant noises radiated from the cable connecting the printed circuit boards with a simple configuration at low cost.

In an aspect of the present invention, the above object is achieved by providing a cable arranging structure comprising first and second printed circuit boards, at least a pair of electrically conductive members arranged oppositely between the first and second printed circuit boards and showing an electric potential substantially equal to that of the ground and a cable arranged to electrically connect the first and second printed circuit boards and allow them to exchange electric signals, the cable being entirely arranged in a space defined by and located between the electrically conductive members.

According to another aspect of the invention, the first printed circuit board is covered by a first shield box having a first opening and the second printed circuit board is covered by a second shield box having a second opening, the at least pair of electrically conductive members being electrically connected to both of the first and second shield boxes, the cable electrically connecting the first and second printed circuit boards by way of the first and second openings.

According to the invention, at least one of the electrically conductive members may have a width greater than the width of the cable.

According to the invention, at least one of the electrically conductive members may be a cabinet connected to both of the first and second shield boxes and holding the first and second printed circuit boards.

According to the invention, the first and second openings may be formed by respectively partly cutting and bending the first and second shield boxes and at least one of the electrically conductive members may be fitted to the bent parts of the shield boxes.

According to the invention, at least one of the electrically conductive members may be connected to the shield boxes by means of gaskets.

According to the invention, at least one of the electrically conductive members may be electrically connected to grounding patterns formed respectively on the first and second printed circuit boards.

The above and other objects of the invention will become more apparent from the following description taken in conjunction with the accompanying drawings.

DESCRIPTION OF THE PREFERRED EMBODIMENTS

Figures 12, 13:
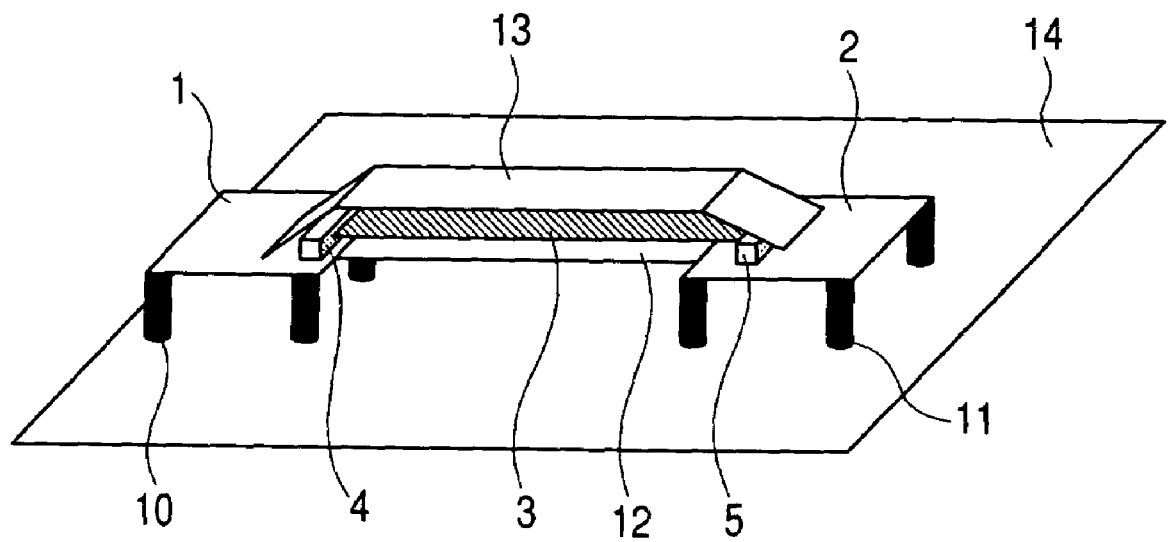
FIG. 12 is a schematic perspective view of the second embodiment of cable arranging structure according to the invention.
FIG. 13 is a schematic illustration of the principle of suppressing radiant noises of a known cable arranging structure.

To begin with, the principle of suppressing radiant noises radiated from a cable according to the invention will be described by referring to FIGS. 13 to 15. FIG. 13 is a schematic illustration of the electric field (electric line of force) generated by a cable when no anti-noise measure is taken. In FIG. 13, reference symbol 100 denotes a cable, which is a flat cable in the illustrated instance. Reference symbol 110 denotes the electric field (electric line of force) generated by the cable 100 and radiant noises are radiated along the electric field (electric line of force). As shown in FIG. 13, radiant noises radially spread from the cable 100.

Figure 14:
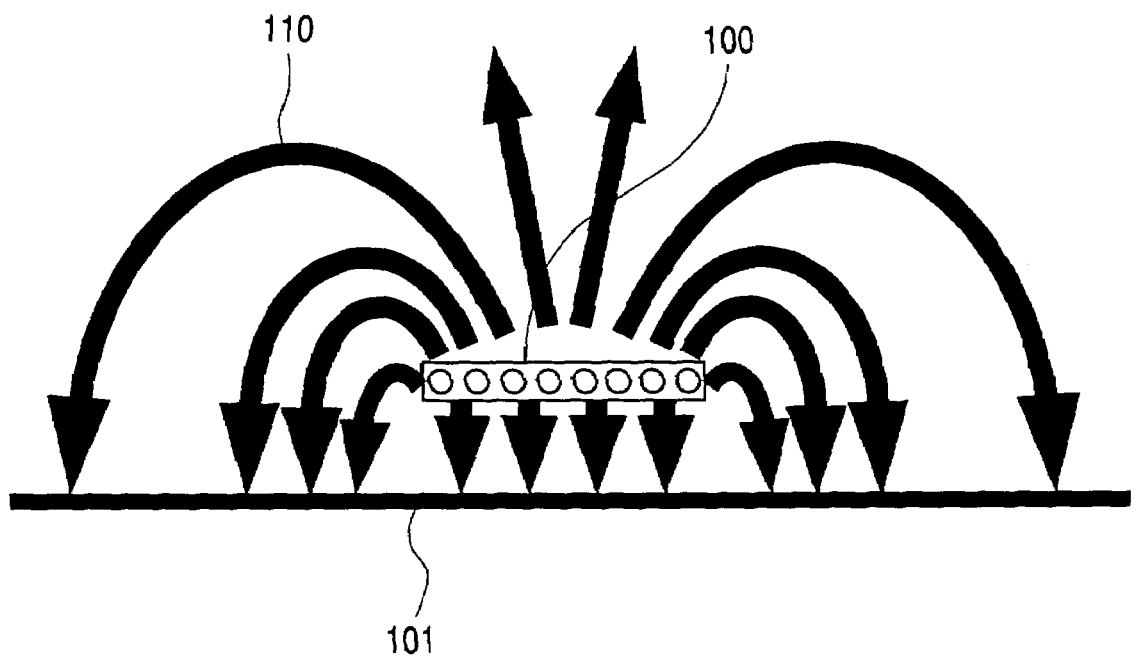
FIG. 14 is a schematic illustration of the principle of suppressing radiant noises of another known cable arranging structure.

FIG. 14 is a schematic illustration of the electric field 110 generated by a cable 100 that is arranged close to an electrically conductive member 101 as shown in the above cited Japanese Patent Application Laid-Open No. 11-40900. The electrically conductive member 101 is made to have a width sufficiently greater than the width of the cable 100. Since the electric field are apt to be directed from a high electric potential to a low electric potential, the radiant noises generated from the lower surface of the cable 100 are substantially completely suppressed by the electrically conductive member 101 when the cable 100 is arranged close to the electrically conductive member 101 as seen from FIG. 14. It is also seen that the radiant noises generated from the upper surface of the cable 100 are also suppressed by the electrically conductive member 101 to a large extent.

Figure 15:
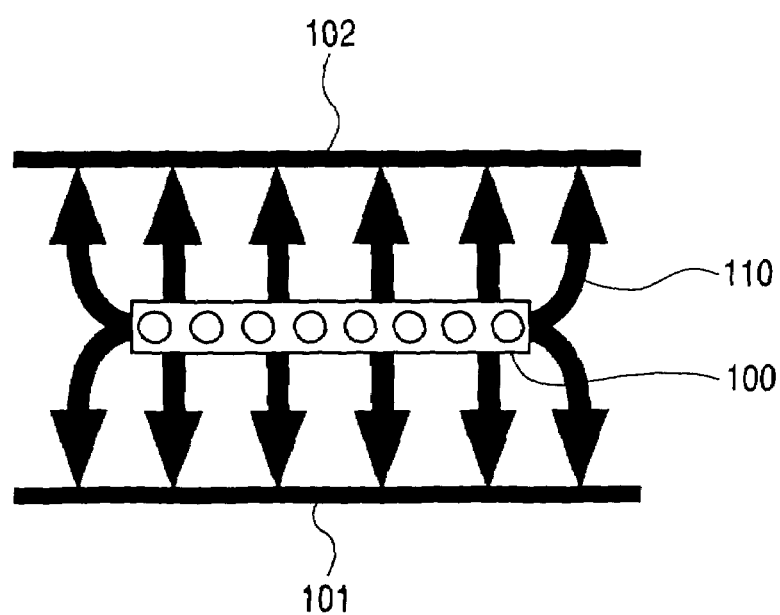
FIG. 15 is a schematic illustration of the principle of suppressing radiant noises of a cable arranging structure according to the invention.

FIG. 15 is a schematic illustration of the electric field 110 generated by a cable 100 that is arranged between a pair of electrically conductive members 101, 102 according to the invention. Note that the distance separating the cable 100 and each of the electrically conductive members 101, 102 is by far greater than the distance separating the cable 100 and the electrically conductive member 101 in FIG. 14, where the cable 100 is arranged close to the electrically conductive member 101. The electrically conductive member 101 is made to have a width sufficiently greater than the width of the cable 100, whereas the width of the electrically conductive member 102 is slightly greater than that of the cable 100. As seen from FIG. 15, the radiant noises generated from the lower surface of the cable 100 are suppressed by the electrically conductive member 101 to a large extent. Further, the radiant noises generated from the upper surface of the cable are suppressed by the electrically conductive member 102 to a large extent. Therefore, the arrangement of FIG. 15 can suppress radiant noises to a large extent if compared with that of FIG. 13 and is as effective as or more effective than the arrangement of FIG. 14 for suppressing radiant noises.

Now, embodiments of the present invention will be described in greater detail by referring to the accompanying drawings.

First Embodiment

Figure 1:
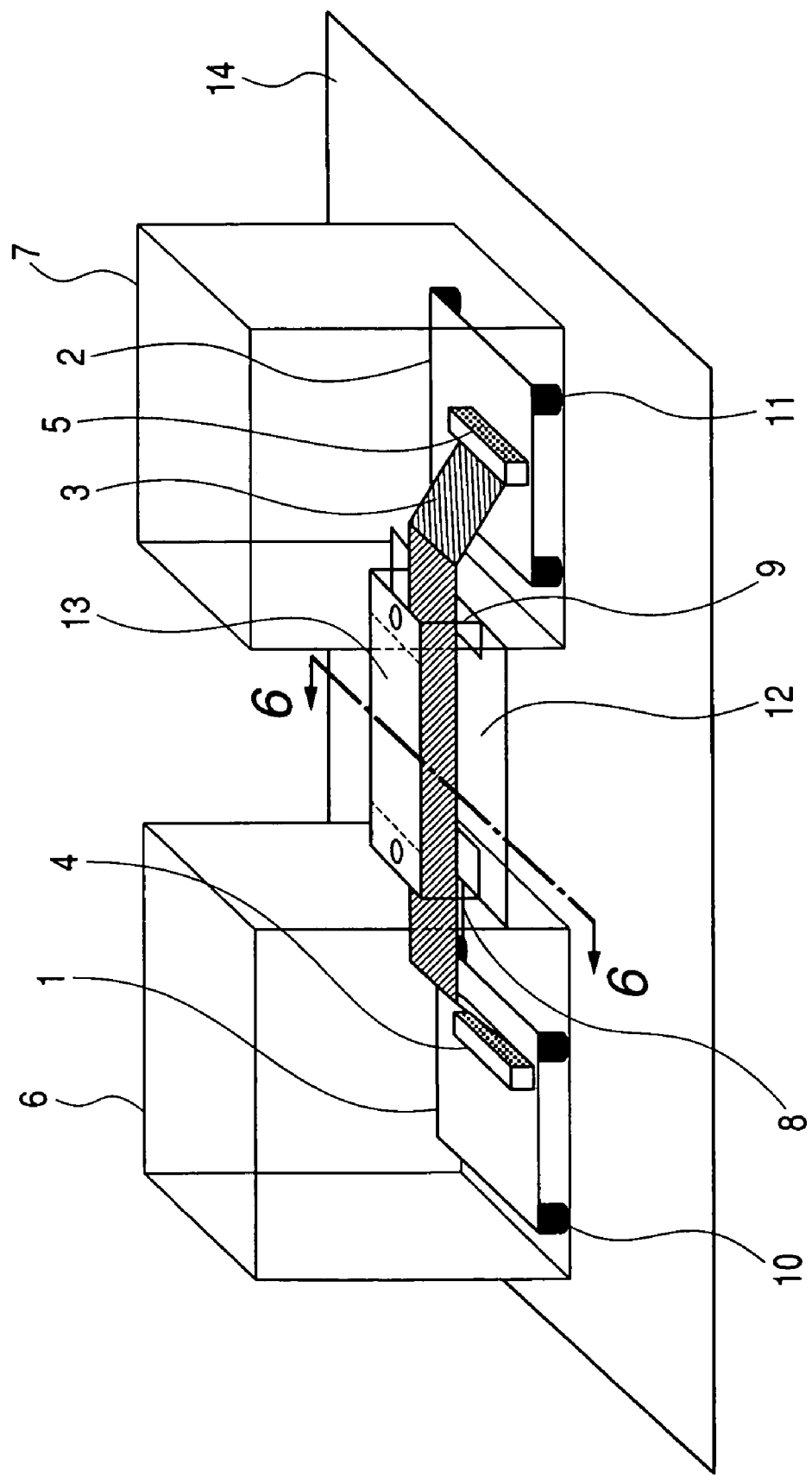
FIG. 1 is a schematic perspective view of the first embodiment of cable arranging structure according to the invention.

FIG. 1 is a schematic perspective view of the first embodiment of cable arranging structure according to the invention. The embodiment is illustrated partly by phantom lines to help understanding of the following description. Referring to FIG. 1, reference symbol 1 denotes a first printed circuit board and reference symbol 2 denotes a second printed circuit board, whereas reference symbol 3 denotes a cable, which is in fact a flat cable, connecting the first printed circuit board 1 and the second printed circuit board 2. The cable 3 is connected to the first printed circuit board 1 by way of a connector 4 and to the second printed circuit board 2 by way of another connector 5. The first printed circuit board 1 and the second printed circuit board 2 mutually exchange electric signals by way of the cable 3. In FIG. 1, reference symbol 6 denotes a first shield box formed so as to cover the first printed circuit board 1, whereas reference symbol 7 denotes a second shield box formed so as to cover the second printed circuit board 2. The first and second shield boxes 6, 7 show an electric potential substantially equal to that of the ground potential. The first shield box 6 is provided with an opening 8 through which the cable 3 extends, whereas the second shield box 7 is provided with an opening 9 through which the cable 3 extends. In FIG. 1, reference symbol 10 denotes a total of four electrically conductive spacers arranged on the bottom surface of the first printed circuit board 1. The first printed circuit board 1 is rigidly held to a cabinet 14 by means of the spacers 10. Reference symbol 11 denotes a total of four electrically conductive spacers arranged on the bottom surface of the second printed circuit board 2. The second printed circuit board 2 is rigidly held to the cabinet 14 by means of the spacers 11. Reference symbol 12 denotes a plate-shaped electrically conductive member arranged below the cable 3 and having a width sufficiently greater than the width of the cable 3, whereas reference symbol 13 denotes a plate-shaped electrically conductive member arranged above the cable 3 and having a width slightly greater than the width of the cable 3. The electrically conductive member 12 is rigidly held and electrically connected to the first shield box 6 at one of the opposite ends thereof located close to the opening 8 and also to the second shield box 7 at the other end located close to the opening 9. Similarly, electrically conductive member 13 is rigidly held and electrically connected to the first shield box 6 at one of the opposite ends thereof located close to the opening 8 and also to the second shield box 7 at the other end located close to the opening 9. Thus, the cable 3 is substantially entirely arranged in a space defined by and located between the electrically conductive members 12, 13 both of which show an electric potential substantially equal to that of the ground potential.

Figure 2:
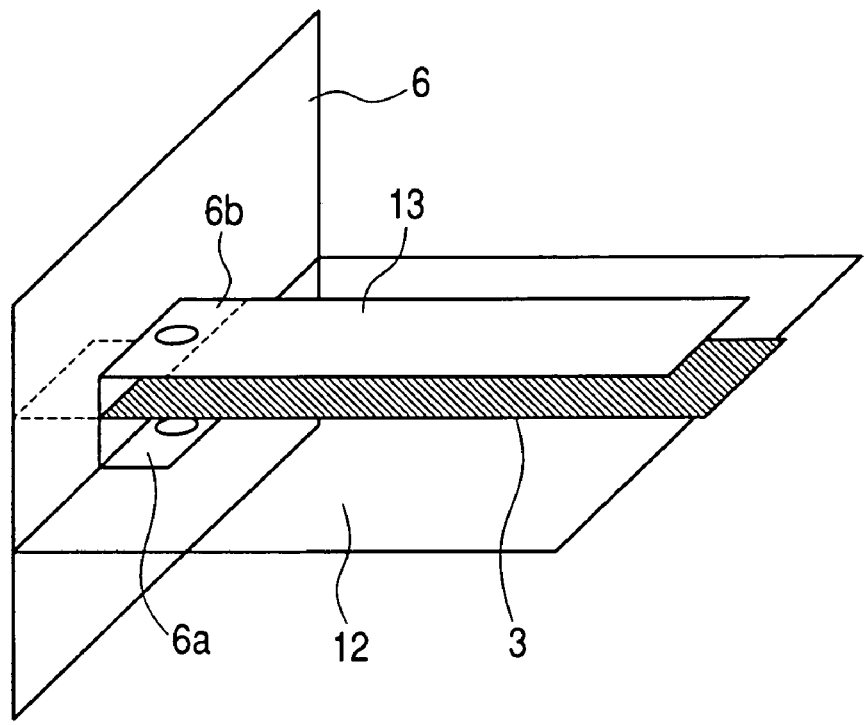
FIG. 2 is an enlarged schematic view of the opening of one of the shield boxes of the cable arranging structure of FIG. 1.
Figure 3:
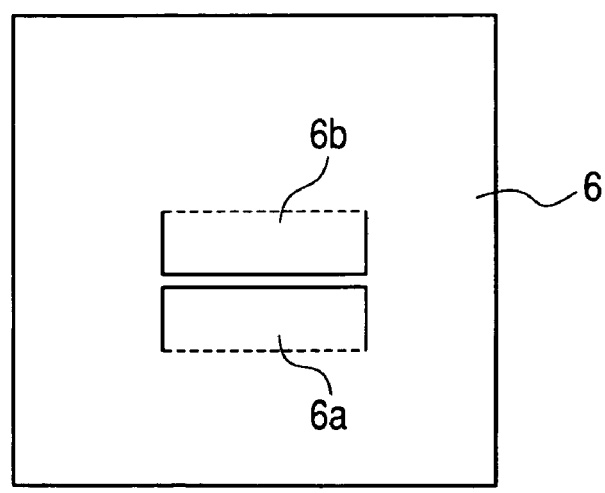
FIG. 3 is a schematic illustration of a process of forming the opening of each of the shield boxes of the cable arranging structure of FIG. 1.

Now, the fixed connection structure for connecting the shield boxes 6, 7 and the electrically conductive members 12, 13 will be described in terms of the part of the embodiment connecting the shield box 6 and the electrically conductive members 12, 13. FIG. 2 is an enlarged schematic view of the part of the embodiment connecting the shield box 6 and the electrically conductive members 12, 13. Referring to FIGS. 2 and 3, firstly the shield box 6 is partly cut to produce flaps 6a, 6b in a manner as shown in FIG. 3. Then, the flaps 6a, 6b are bent outwardly along the broken lines in FIG. 3 to produce an opening 8. Thereafter, the electrically conductive member 12 is rigidly held at one of the opposite ends thereof to the flap 6a by means of screws or the like. Similarly, the electrically conductive member 13 is rigidly held at one of the opposite ends thereof to the flap 6b by means of screws or the like. In a similar manner, the electrically conductive members 12, 13 are also rigidly held to the shield box 7 at the respective other ends. By using such a structure, the electrically conductive members 12, 13 can be securely held in position as so many flat plates without difficulty. Additionally, since the electrically conductive members 12, 13 and the shield boxes 6, 7 are mutually connected without producing any gap, it is possible to effectively suppress radiant noises that are produced from the connecting parts of the electrically conductive members. Since the part of connecting the cable 3 and the printed circuit boards 1, 2 is located inside the shield boxes 6, 7, the shield boxes 6, 7 can suppress radiant noises.

While the cable 3 is described above as flat cable, this embodiment is by no means limited to such and the cable 3 may alternatively be a wire cable, a twisted cable, a flexible cable or a shield cable that may be a coaxial cable.

The electrically conductive member 12 has a width sufficiently greater than the width of the cable 3, whereas the electrically conductive member 13 has a width slightly greater than the width of the cable 3. However, this embodiment is by no means limited thereto. The embodiment provides a satisfactory effect of suppressing radiant noises even if both of the electrically conductive members 12, 13 may alternatively have a width smaller than the width of the cable 3, although the effect of suppressing radiant noises is more remarkable when at least one of the electrically conductive members 12, 13 has a width greater than the width of the cable 3.

Figure 4:
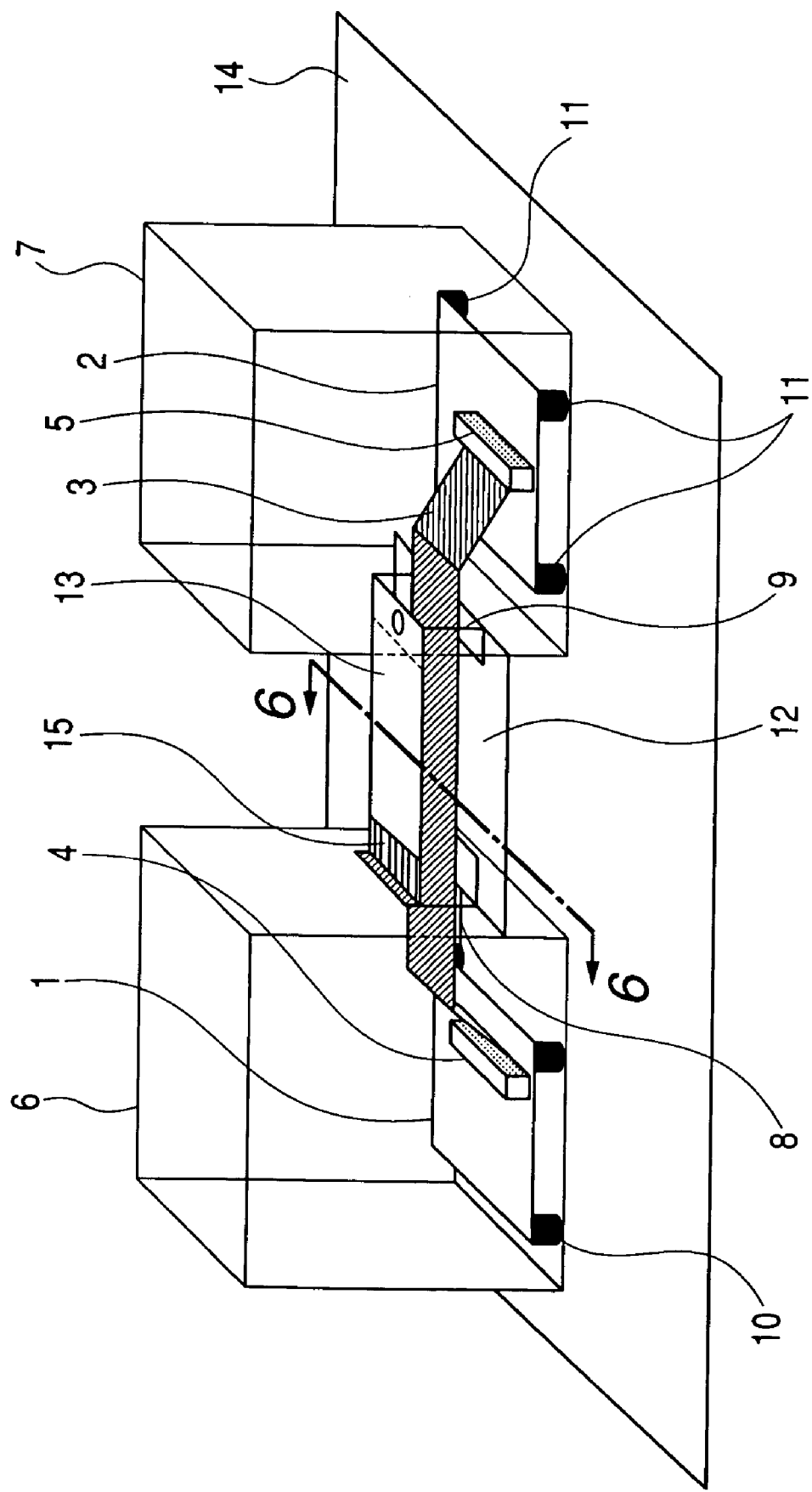
FIG. 4 is a schematic perspective view of an embodiment obtained by modifying the first embodiment of cable arranging structure according to the invention.

The structure of the parts of the embodiment connecting the electrically conductive members 12, 13 and the shield boxes 6, 7 is not limited to the one illustrated in FIGS. 2 and 3 and any different structure may alternatively be used so long as the electrically conductive members 12, 13 and the shield boxes 6, 7 are mutually and rigidly connected without producing any gap. If, for instance, it is difficult to directly and rigidly secure the electrically conductive members 12, 13 to the shield boxes 6, 7 for the reason of assembling procedure or for some other reason, gaskets 15 as shown in FIG. 4 may be used for the parts of the embodiment connecting the electrically conductive members 12, 13 and the shield boxes 6, 7. The use of such gaskets facilitates the operation of rigidly holding the electrically conductive members 12, 13 regardless of the profile of the connecting parts. In FIG. 4, the members same as those of FIG. 1 are denoted respectively by the same reference symbols and will not be described any further.

Figure 5:
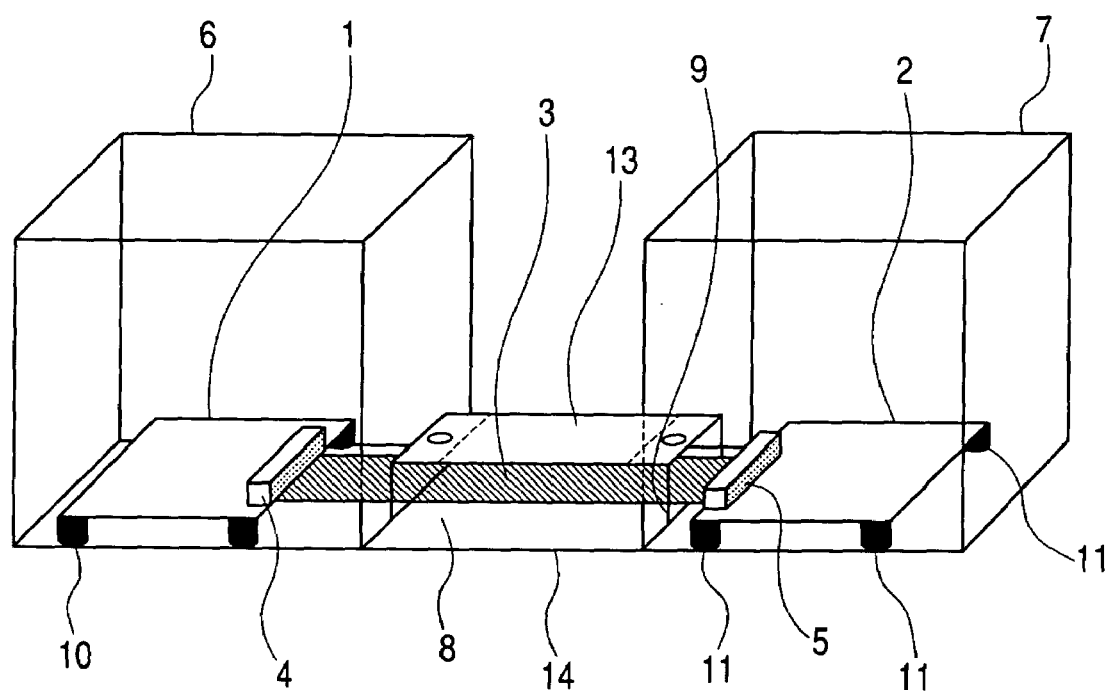
FIG. 5 is a schematic perspective view of another embodiment obtained by modifying the first embodiment of cable arranging structure according to the invention.

The printed circuit boards 1, 2 are rigidly secured to the same cabinet 14 in the above description. However, this embodiment is by no means limited thereto and they may alternatively be secured to respective cabinets, which may be connected to each other by way of some other electrically conductive member. Still alternatively, the cabinet 14 may be used as shown in FIG. 5 for the lower electrically conductive member 12 arranged below the cable 3. The cabinet 14 rigidly secures the printed circuit boards 1, 2 and is electrically connected to the shield boxes 6, 7. With such an arrangement, it is only necessary to add a single electrically conductive member to a position located above the cable so as to consequently simplify the overall structure and further reduce the total cost of the parts of the embodiment. In FIG. 5, the members same as those of FIG. 1 are denoted respectively by the same reference symbols and will not be described any further.

There may be occasions where the cable 3 becomes loose and warped in the space defined by and located between the electrically conductive members 12, 13 and eventually contacts one of both of the electrically conductive members 12, 13. If such an accident occurs, the effect of the provision of the electrically conductive members 12, 13 is same as the one that is observed when the cable 3 is straight and does not contact the electrically conductive members 12, 13 so long as the cable 3 is found within the width of one of the electrically conductive members 12, 13.

Now, the first embodiment of cable arranging structure according to the invention and illustrated in FIG. 1 will be described further by way of an example (Example 1). For the purpose of comparison, an example (Comparative Example 1) in which no anti-noise measure is taken for the cable as shown in FIG. 13 and another example (Comparative Example 2) in which the cable is arranged close to the cabinet in a manner as proposed in Japanese Patent Application Laid-Open No. 11-40900 shown in FIG. 14 will be also described.

EXAMPLE 1

In this example, the printed circuit board 1 is 250 mm long and 150 mm wide and rigidly held to the cabinet 14 at the four corners thereof by means of 17 mm high spacers 10. The shield box 6 is made of galvanized sheet iron and electrically connected to the cabinet 14. It has dimensions of 300 mm in length, 200 mm in width, 50 mm in height and 1.6 mm in thickness. The opening 8 through which the cable 3 is drawn out is 5 mm long and 15 mm wide and the electrically conductive members 12, 13 are respectively secured to the flaps 6a, 6b by means of screws. On the other hand, the printed circuit board 2 is 250 mm long and 150 mm wide and rigidly held to the cabinet 14 at the four corners thereof by means of 17 mm high spacers 11. The shield box 7 is made of galvanized sheet iron and electrically connected to the cabinet 14. It has dimensions of 300 mm in length, 200 mm in width, 50 mm in height and 1.6 mm in thickness. The opening 9 through which the cable 3 is drawn out is 5 mm long and 15 mm wide and the electrically conductive members 12, 13 are respectively secured to the flaps 7a, 7b by means of screws.

Figure 6:
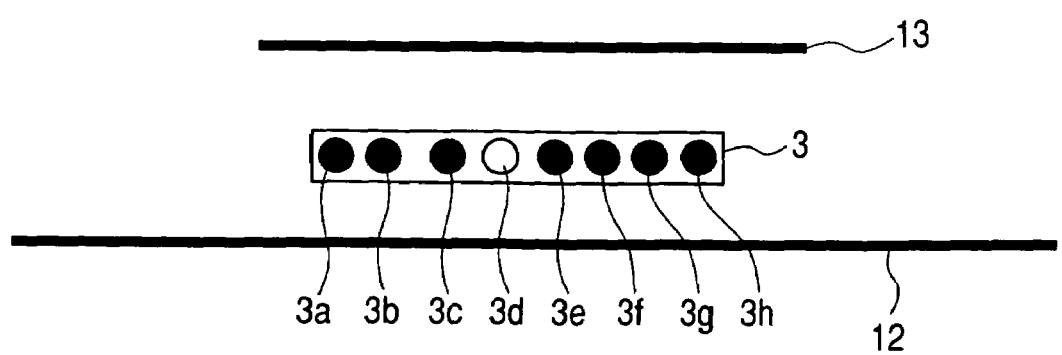
FIG. 6 is a schematic cross sectional view of the embodiment of FIG. 1 taken along line 6—6 to show the structure and the arrangement of the cable in Example 1.

FIG. 6 is a schematic cross sectional view of the embodiment of FIG. 1 taken along line 6—6 to show the structure and the arrangement of the cable 3 in Example 1. The cable 3 is a card type flexible cable that has dimensions of 150 mm in length, 9 mm in width and 0.18 mm in thickness. It contains a total of eight wires, of which wire 3d is adapted to transmit clock signals with a frequency of 20 MHz. The remaining seven wires 3a, 3b, 3c, 3e, 3f, 3g, 3h are grounded. The electrically conductive members 12, 13 are made of galvanized sheet iron. The electrically conductive member 12 arranged below the cable 3 is 100 mm long, 300 mm wide and 1.6 mm thick, whereas the electrically conductive member 13 arranged above the cable 3 is 100 mm long, 15 mm wide and 1.6 mm thick. The cable 3 is separated from both of the electrically conductive members 12, 13 by a gap of 2 mm. Therefore, the electrically conductive members 12, 13 are separated from each other by a distance of 4.18 mm. The electrically conductive member 12 is arranged 20.2 mm above the cabinet 14 and its level agrees with that of the lowest parts of the openings 8, 9. The cable 3 does not contact the electrically conductive members 12, 13.

Figure 7A:
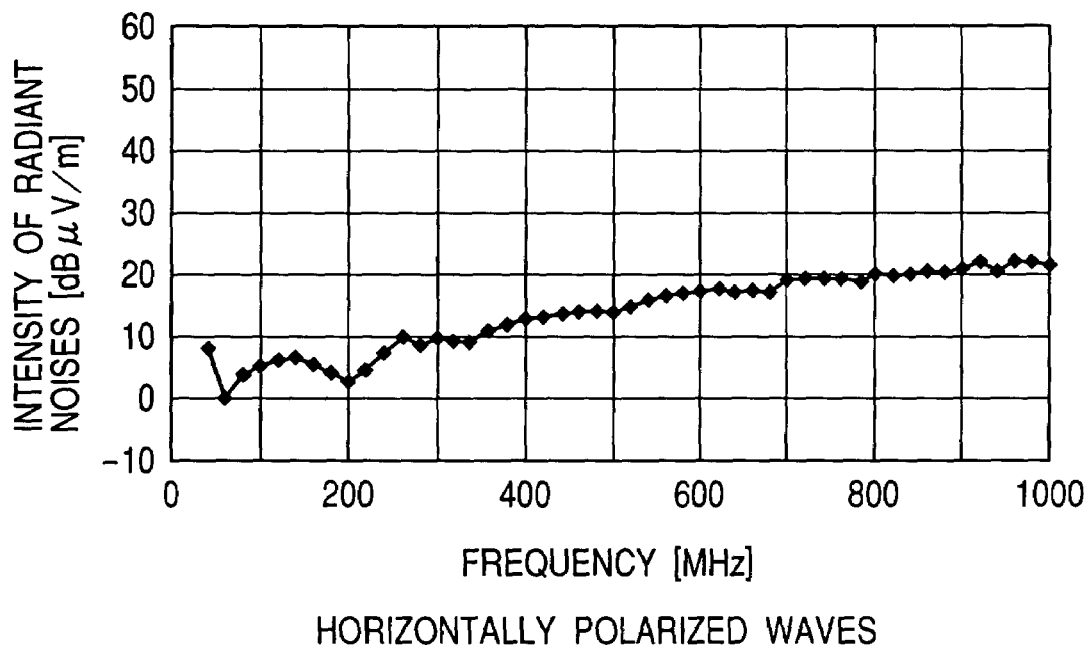
FIGS. 7A and 7B are graphs illustrating the radiant noises of the cable arranging structure as observed in Example 1.
Figure 7B:
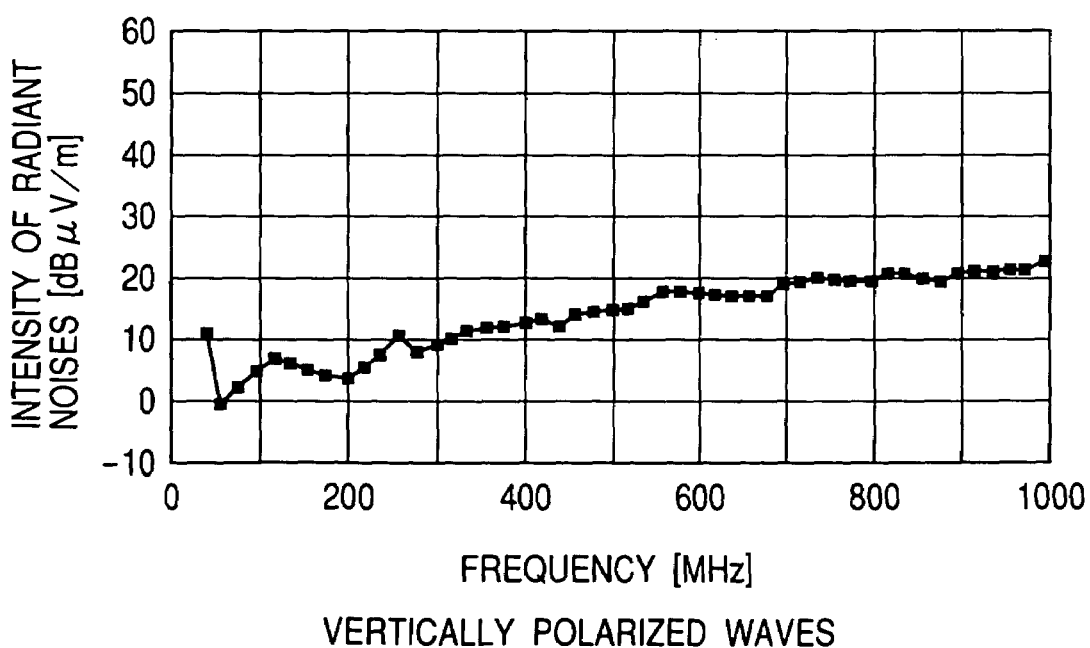

FIGS. 7A and 7B show some of the results obtained by observing radiant noises at a point separated from the cable 3 by 3 m when a clock signal of 20 MHz is transmitted through wire 3d of the cable 3. FIG. 7A shows the intensities of horizontally polarized waves of radiant noises having different frequencies. In FIG. 7A, the horizontal axis represents frequencies and the vertical axis represents the intensities of radiant noises. FIG. 7B shows the intensity of the vertically polarized waves of the radiant noises having different frequencies. Also in FIG. 7B, the horizontal axis represents frequencies and the vertical axis represents the intensities of radiant noises. As seen from FIGS. 7A and 7B, radiant noises of any frequencies are very low to prove that the arrangement provides a remarkable effect of suppressing radiant noises.

COMPARATIVE EXAMPLE 1

Figure 8:
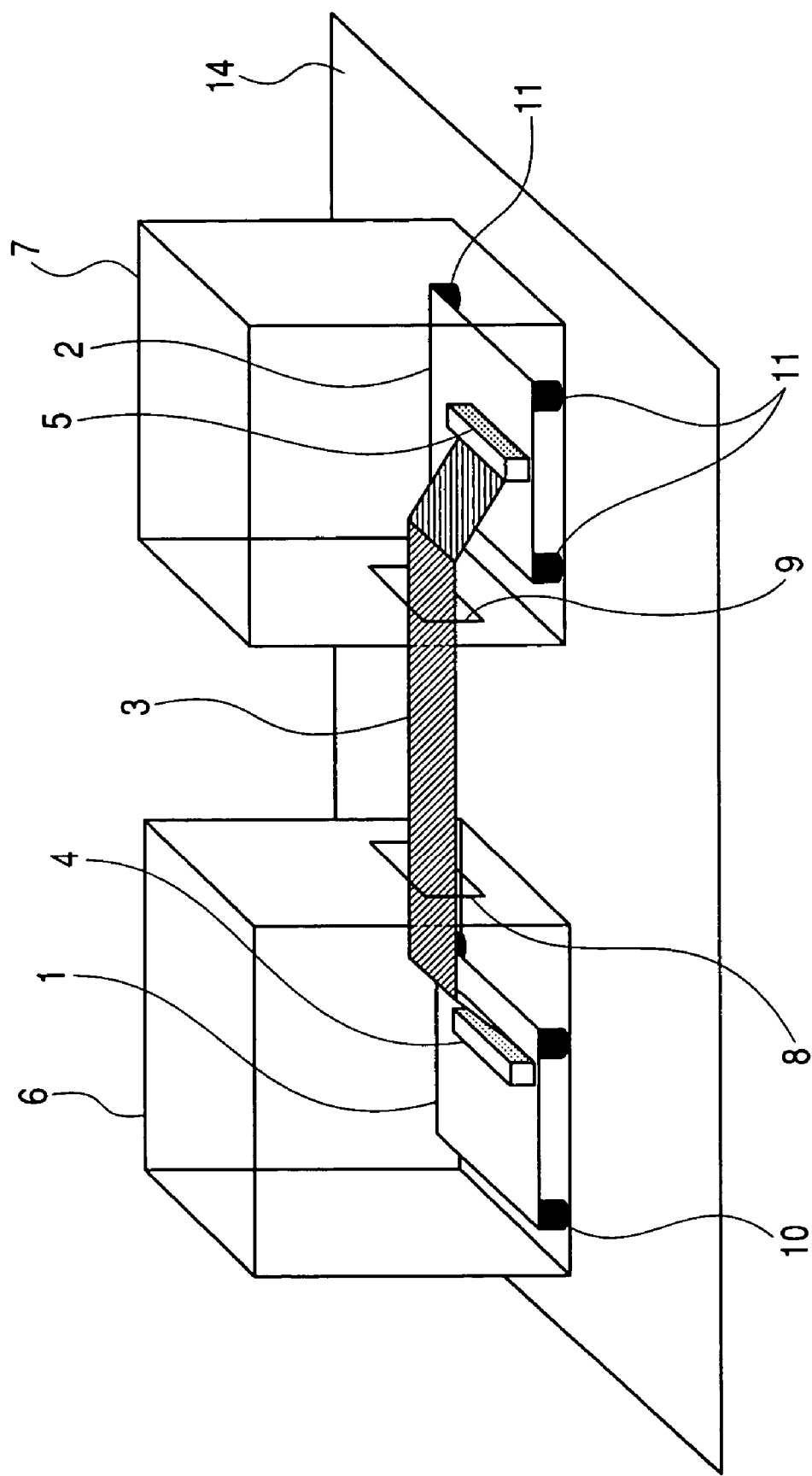
FIG. 8 is a schematic perspective view of the cable arranging structure used in Comparative Example 1.
Figure 9A:
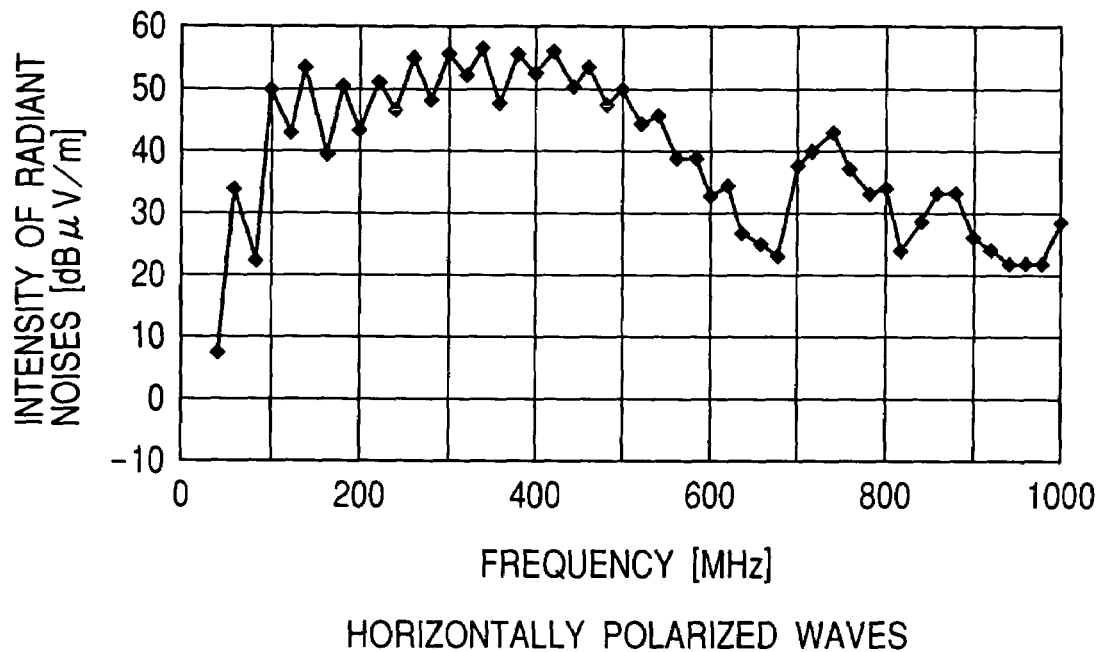
FIGS. 9A and 9B are graphs illustrating the radiant noises of the cable arranging structure as observed in Comparative Example 1.
Figure 9B:
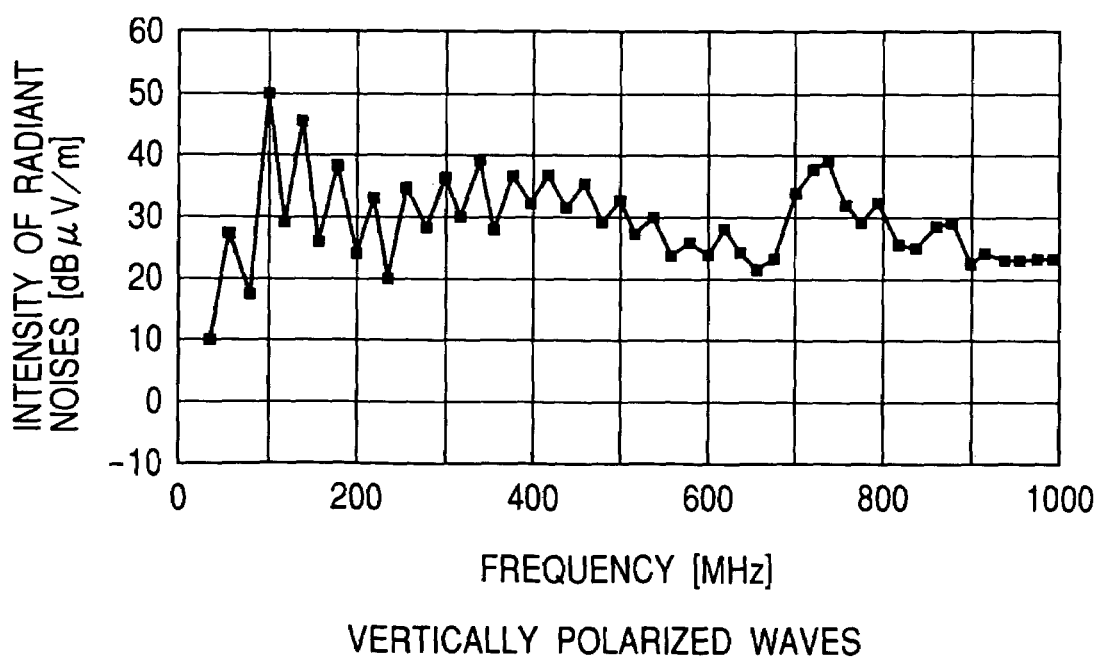

FIG. 8 is a schematic perspective view of the cable arranging structure of Comparative Example 1. The cable arranging structure of Comparative Example 1 is formed by removing the electrically conductive members 12, 13 from the cable arranging structure of above described Example 1. FIGS. 9A and 9B show some of the results obtained by observing radiant noises at a point separated from the cable 3 by 3 m when a clock signal of 20 MHz is transmitted through wire 3d of the cable 3. FIG. 9A shows the intensities of horizontally polarized waves of radiant noises having different frequencies. In FIG. 9A, the horizontal axis represents frequencies and the vertical axis represents the intensities of radiant noises. FIG. 9B shows the intensity of the vertically polarized waves of the radiant noises having different frequencies. Also in FIG. 9B, the horizontal axis represents frequencies and the vertical axis represents the intensities of radiant noises. By comparing FIGS. 7A and 9A, it will be seen that radiant noises occur more or less intensely in Comparative Example 1 in terms of horizontally polarized waves in a frequency range between 60 and 600 MHz. It will be seen by comparing FIGS. 7B and 9B that radiant noises occur very intensely in Comparative Example 1 in terms of vertically polarized waves in a frequency range between 60 and 600 MHz. The occurrence of radiant noises is particularly remarkable at 100 MHz.

COMPARATIVE EXAMPLE 2

Figure 10:
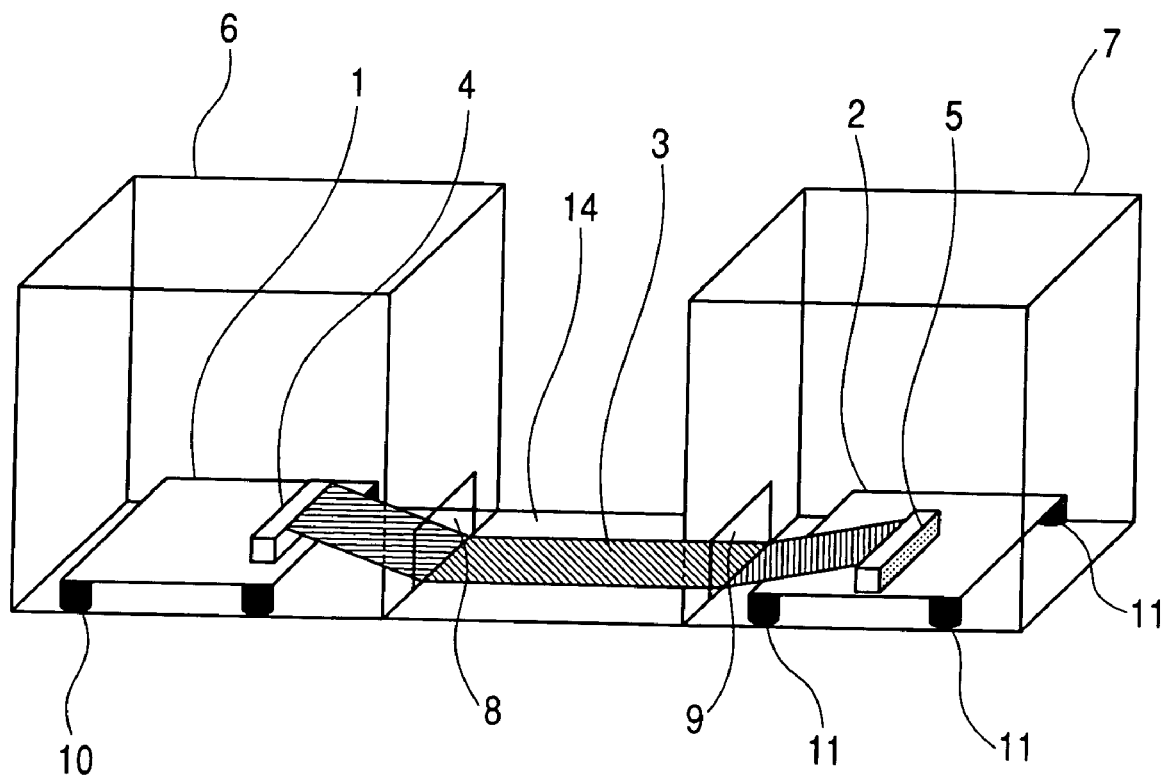
FIG. 10 is a schematic perspective view of the cable arranging structure used in Comparative Example 2.
Figure 11A:
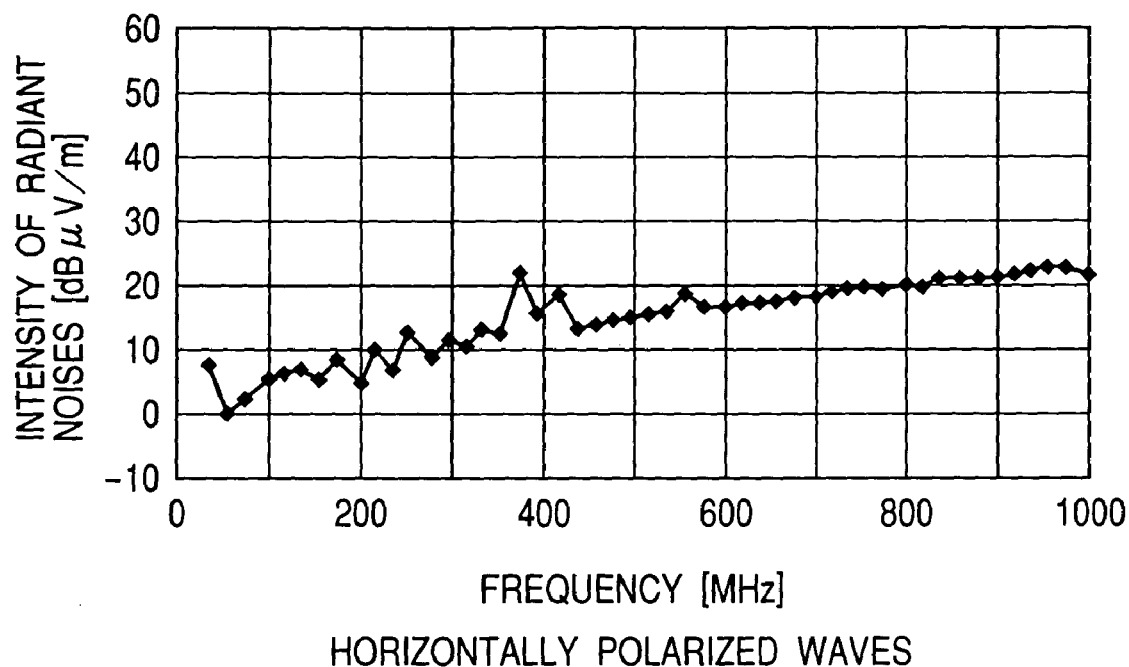
FIGS. 11A and 11B are graphs illustrating the radiant noises of the cable arranging structure as observed in Comparative Example 2.
Figure 11B:
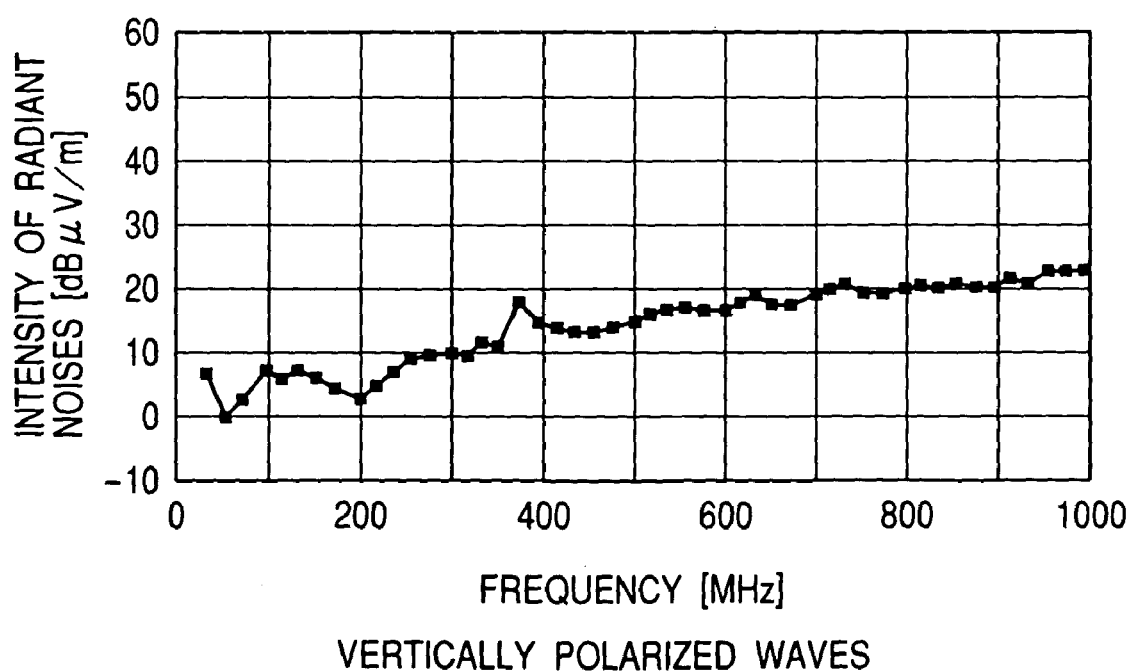

FIG. 10 is a schematic perspective view of the cable arranging structure of Comparative Example 2. The cable arranging structure of Comparative Example 2 is formed by removing the electrically conductive members 12, 13 from the cable arranging structure of above described Example 1 and the cable 3 is placed closer to the cabinet 14. As a matter of fact, the cabinet 14 and the cable 3 are held in contact with each other and rigidly secured by means of electrically insulating adhesive tapes. FIGS. 11A and 11B show some of the results obtained by observing radiant noises at a point separated from the cable 3 by 3 m when a clock signal of 20 MHz is transmitted through wire 3d of the cable 3. FIG. 11A shows the intensities of horizontally polarized waves of radiant noises having different frequencies. In FIG. 11A, the horizontal axis represents frequencies and the vertical axis represents the intensities of radiant noises. FIG. 11B shows the intensity of the vertically polarized waves of the radiant noises having different frequencies. Also in FIG. 11B, the horizontal axis represents frequencies and the vertical axis represents the intensities of radiant noises. It will be seen by comparing FIG. 7A and FIG. 11A that the effect of suppressing radiant noises of the arrangement of Comparative Example 2 is substantially same as that of Example 1 in terms of horizontally polarized waves. By comparing FIG. 7B and FIG. 11B, it will be seen that the effect of suppressing radiant noises of the arrangement of Comparative Example 2 is substantially same as that of Example 1 also in terms of vertically polarized waves.

As described above in detail, the cable arranging structure of the first embodiment can easily suppress radiant noises even when it is difficult to bent the cable or when it is difficult to place the cable close to the cabinet due to the positions of the two printed circuit boards because it is not necessary to warp or bend the cable in this embodiment. It is only necessary to rigidly fix the two electrically conductive members without the need of processing the cabinet. In short, a cable arranging structure according to the present invention is structurally very simple and it neither takes time nor labor to place it in position. Furthermore, a cable arranging structure according to the invention does not involve any additional cost other than the cost of the electrically conductive members because no extra parts are required to hold the cable. Additionally, the parts connecting the cable and the printed circuit boards are located inside the shield boxes and the parts connecting the electrically conductive members and the shield boxes do not boost radiant noises because the electrically conductive members are reliably arranged above and below the cable at those parts. Besides, as seen by comparing Example 1 and Comparative Example 2, the effect of suppressing radiant noises of a cable arranging structure according to the invention is substantially same as that of placing the cable close to the cabinet, which is sufficient for electronic devices to suppress radiant noises. What is more, since the printed circuit boards are covered respectively by the shield boxes and the electrically conductive members are connected to the shield boxes, radiant noises other than those from the cable can also be effectively suppressed and the electrically conductive members can be connected to the ground potential without difficulty.

Thus, radiant noises emitted from copying machines, printers, FAX machines, electronic scanners and so on are suppressed to a great extent to minimize the influences of radiant noises on other electronic devices when they are equipped with a cable arranging structure according to the invention and having a configuration as described above by referring to the first embodiment.

Second Embodiment

FIG. 12 is a schematic perspective view of the second embodiment of cable arranging structure according to the invention, showing how it is used. The second embodiment differs from the above described first embodiment in that it does not have the shield boxes 6, 7 of the first embodiment and the electrically conductive members 12, 13 are connected to the grounded substrates of the printed circuit boards 1, 2. In FIG. 12, the components same as those of FIG. 1 are denoted respectively by the same reference symbols and will not be described any further.

The electrically conductive member 13 arranged above the cable 3 is bent at the opposite ends and connected to the grounded substrates of the printed circuit boards 1, 2 at the bent ends. On the other hand, the electrically conductive member 12 arranged below the cable 3 is connected to the grounded substrates of the printed circuit boards 1, 2 without being bent. Note, however, this embodiment is not limited thereto. Alternatively, for example, the electrically conductive member 12 may be bent without bending the electrically conductive member 13. Still alternatively, both of the electrically conductive members 12, 13 may be bent. Additionally, the electrically conductive member 12 may be replaced by a cabinet 14 as shown in FIG. 5.

The second embodiment of cable arranging structure having a configuration as described above is as effective as the first embodiment that is described earlier for suppressing radiant noises. Additionally, since the electrically conductive members are arranged reliably above and below the parts of the cable where it is connected to the printed circuit boards, radiant noises coming out from those parts are not boosted at all. The second embodiment provides an additional advantage that it can be used when it is not possible to use shield boxes or when it is not necessary to use shield boxes.

As described above in detail, with a cable arranging structure according to the invention, the cable is neither warped nor bent so that the structure can easily suppress radiant noises even when it is difficult to bent the cable or when it is difficult to place the cable close to the cabinet due to the positions of the two printed circuit boards. It is only necessary to rigidly fix the two electrically conductive members without the need of processing the cabinet. In short, a cable arranging structure according to the present invention is structurally very simple and it neither takes time nor labor to place it in position. Furthermore, a cable arranging structure according to the invention does not involve any additional cost other than the cost of the electrically conductive members because no extra parts are required to hold the cable. Additionally, the parts connecting the electrically conductive members and the shield boxes do not boost radiant noises because the electrically conductive members are reliably arranged above and below the cable at those parts.

Furthermore, since the printed circuit boards are covered respectively by the shield boxes and the electrically conductive members are connected to the shield boxes, radiant noises other than those from the cable can also be effectively suppressed and the electrically conductive members can be connected to an electric potential substantially equal to the ground potential without difficulty. Besides, since the parts connecting the cable and the printed circuit boards are located inside the shield boxes and the electrically conductive members are arranged solidly above and below the parts connecting the electrically conductive members and the shield boxes, radiant noises coming from those parts are not boosted.

The effect of suppressing radiant noises becomes even more remarkable when at least one of the electrically conductive members is made wider than the cable.

When the cabinet holding the printed circuit boards is used as one of the electrically conductive members, only a single electrically conductive member needs to be added and placed above the cable so that the overall arrangement is further simplified to further reduce the cost.

The electrically conductive members can be even more reliably fitted to the shield boxes to reliably suppress radiant noises coming from the parts of the structure where the electrically conductive members are fitted when the openings of the shield boxes are formed by partly cutting them, bending the cut parts and connecting the electrically conductive members to the bent areas.

The electrically conductive members can be rigidly held in position regardless of the profiles of the parts connecting the electrically conductive members and the shield boxes when gaskets are used for those parts. Additionally, a cable arranging structure according to the invention can be so used as to electrically connect the electrically conductive members to the grounding patterns formed on the printed circuit boards even when it is not possible to form shield boxes or when shield boxes are not necessary.

Finally, radiant noises emitted from copying machines, printers, FAX machines, electronic scanners and so on can be suppressed to a great extent to minimize the influences of radiant noises on other electronic devices when they are equipped with a cable arranging structure according to the invention.

What is claimed is:

1. A cable arranging structure comprising:
   first and second printed circuit boards;
   a first shield box covering said first printed circuit board and having a first opening;
   a second shield box covering said second printed circuit board and having a second opening;
   at least two electrically conductive members electrically connected to said first and second shield boxes and arranged oppositely relative to each other between said first and second shield boxes, said electrically conductive members being in the shape of a substantially flat plate and remaining untouched with each other;
   a cable connecting said first and second printed circuit boards by way of said first and second openings,
   the part of said cable located outside said first and second shield boxes being entirely arranged between said at least two electrically conductive members.

2. A structure according to claim 1, wherein at least one of said electrically conductive members has a width greater than the width of said cable.

3. A structure according to claim 1, wherein one of said electrically conductive members is a cabinet connected to both of said first and second shield boxes and holding said first and second printed circuit boards.

4. A structure according to claim 1, wherein said first and second openings are formed by respectively partly cutting and bending said first and second shield boxes and at least one of said electrically conductive members is fitted to the bent parts of said shield boxes.

5. A structure according to claim 1, wherein at least one of said electrically conductive members is connected to said shield boxes by means of gaskets.

\* \* \* \* \*